US012804910B2

(12) United States Patent
Huang et al.

(10) Patent No.: US 12,804,910 B2
(45) Date of Patent: Nov. 17, 2026

(54) SEMICONDUCTOR STRUCTURE INCLUDING MEMORY ELEMENT

(71) Applicant: UNITED MICROELECTRONICS CORP., Hsinchu (TW)

(72) Inventors: Yi-An Huang, New Taipei City (TW); Shu-Hung Yu, Kaohsiung City (TW); Chuan-Fu Wang, Miaoli County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 536 days.

(21) Appl. No.: 18/231,448

(22) Filed: Aug. 8, 2023

(65) Prior Publication Data

US 2025/0017024 A1 Jan. 9, 2025

(30) Foreign Application Priority Data

Jul. 3, 2023 (TW) ................................ 112124747

(51) Int. Cl.
*H10B 63/00* (2023.01)

(52) U.S. Cl.
CPC .................................... *H10B 63/80* (2023.02)

(58) Field of Classification Search
CPC ........ H10B 63/80; H10B 63/30; H10B 63/00; H10B 43/27; H10B 43/10; H10B 43/35; H10B 43/40; H10N 70/20; H10N 70/8833; H01L 24/08; H01L 23/60; H01L 25/0657; H01L 25/18; H01L 2224/08145; H01L 2924/1431; H01L 2924/1434; H01L 2924/30205; H01L 2225/06541; H01L 21/76898; H01L 23/481; H01L 25/0652; H01L 24/82; H10D 89/611; H10D 84/80
See application file for complete search history.

(56) References Cited

U.S. PATENT DOCUMENTS

| | | | | |
|---|---|---|---|---|
| 8,922,243 | B2 * | 12/2014 | Jayasena | G11C 29/70 326/38 |
| 8,952,426 | B2 * | 2/2015 | Maejima | H01L 23/535 257/214 |
| 9,287,271 | B2 * | 3/2016 | Wang | H10B 12/053 |
| 9,437,606 | B2 * | 9/2016 | Makala | H10D 88/01 |
| 9,472,596 | B2 * | 10/2016 | Tsai | H10B 63/30 |
| 9,576,973 | B2 * | 2/2017 | Lee | H10B 43/10 |
| 9,613,689 | B1 * | 4/2017 | Takaki | H01L 23/528 |
| 9,679,907 | B1 * | 6/2017 | Kaneko | H10B 43/35 |

(Continued)

*Primary Examiner* — Caleb E Henry
(74) *Attorney, Agent, or Firm* — WPAT, PC

(57) ABSTRACT

A semiconductor structure is provided. The semiconductor structure includes a plurality of interconnection layers disposed along a first direction, a memory element in the plurality of interconnection layers, a first conductive structure in the plurality of interconnection layers and electrically connected to the memory element, and a second conductive structure in the plurality of interconnection layers and electrically connected to the memory element. The first conductive structure includes a first conductive line and a second conductive line disposed along the first direction. The second conductive structure includes a third conductive line and a fourth conductive line disposed along the first direction. The second conductive line and the memory element are in the same interconnection layer. The third conductive line and the fourth conductive line are above the first conductive line and the second conductive line.

20 Claims, 2 Drawing Sheets

(56) References Cited

U.S. PATENT DOCUMENTS

| | | | | |
|---|---|---|---|---|
| 9,875,929 | B1 * | 1/2018 | Shukla | H10B 43/27 |
| 10,141,221 | B1 * | 11/2018 | Lai | H01L 21/76831 |
| 10,163,924 | B2 * | 12/2018 | Ahn | H10B 41/27 |
| 10,217,746 | B1 * | 2/2019 | Kim | H10B 63/845 |
| 10,290,648 | B1 * | 5/2019 | Zhou | H10B 41/27 |
| 10,354,980 | B1 * | 7/2019 | Mushiga | H01L 24/89 |
| 10,381,443 | B2 * | 8/2019 | Matsumoto | H10B 43/27 |
| 10,510,738 | B2 * | 12/2019 | Kim | H10B 43/35 |
| 10,515,897 | B2 * | 12/2019 | Nishikawa | H01L 21/76847 |
| 10,515,907 | B2 * | 12/2019 | Fujita | H10B 43/27 |
| 10,522,624 | B2 * | 12/2019 | Van Houdt | H10N 70/20 |
| 10,559,582 | B2 * | 2/2020 | Nishikawa | H10B 43/27 |
| 10,770,424 | B1 * | 9/2020 | Shih | H10W 42/121 |
| 10,784,196 | B2 * | 9/2020 | Lu | H10W 20/057 |
| 11,183,246 | B1 * | 11/2021 | Oh | H10B 43/27 |
| 11,563,021 | B2 * | 1/2023 | Huang | H10B 43/35 |
| 2010/0109164 | A1 * | 5/2010 | Kang | H01L 24/25 438/109 |
| 2010/0195364 | A1 * | 8/2010 | Riho | G11C 5/063 365/63 |
| 2015/0016172 | A1 * | 1/2015 | Loh | G06F 3/0608 365/51 |
| 2016/0118399 | A1 * | 4/2016 | Son | H10B 43/40 257/314 |
| 2016/0196863 | A1 * | 7/2016 | Shin | G11C 11/406 365/222 |
| 2016/0254240 | A1 * | 9/2016 | Chen | G06F 30/39 257/738 |
| 2016/0365352 | A1 * | 12/2016 | Nishikawa | H10B 43/10 |
| 2017/0053906 | A1 * | 2/2017 | Or-Bach | H10B 43/20 |
| 2017/0110160 | A1 * | 4/2017 | Seo | G11C 5/063 |
| 2017/0162597 | A1 * | 6/2017 | Sharangpani | H01L 21/02178 |
| 2017/0236836 | A1 * | 8/2017 | Huo | H10D 1/00 257/324 |
| 2018/0277556 | A1 * | 9/2018 | Kang | H10B 43/10 |
| 2018/0342557 | A1 * | 11/2018 | Mori | H10N 70/823 |
| 2019/0074290 | A1 * | 3/2019 | Xiao | H10D 30/696 |
| 2019/0355735 | A1 * | 11/2019 | Kothari | H01L 21/32139 |
| 2020/0051904 | A1 * | 2/2020 | Tang | H10B 43/50 |
| 2020/0126974 | A1 * | 4/2020 | Liu | H10D 88/01 |
| 2020/0185307 | A1 * | 6/2020 | Tsai | H01L 25/50 |
| 2020/0211968 | A1 * | 7/2020 | Yang | H10W 20/063 |
| 2020/0227398 | A1 * | 7/2020 | Oh | G11C 16/0483 |
| 2020/0350203 | A1 * | 11/2020 | Fratin | G11C 5/025 |
| 2020/0388650 | A1 * | 12/2020 | Nardi | G11C 13/0026 |
| 2020/0395407 | A1 * | 12/2020 | Takahashi | H10N 70/066 |
| 2020/0395408 | A1 * | 12/2020 | Takahashi | H10B 63/845 |
| 2020/0402988 | A1 * | 12/2020 | Howder | H10B 43/27 |
| 2020/0403033 | A1 * | 12/2020 | Lilak | H10B 43/50 |
| 2020/0411480 | A1 * | 12/2020 | Yang | H01L 25/50 |
| 2021/0265364 | A1 * | 8/2021 | Huang | H10B 43/20 |
| 2021/0366824 | A1 * | 11/2021 | Chung | H10W 20/056 |
| 2021/0375901 | A1 * | 12/2021 | Oh | H10B 43/40 |
| 2021/0383874 | A1 * | 12/2021 | Oh | H01L 25/18 |
| 2021/0384160 | A1 * | 12/2021 | Oh | H10B 43/40 |
| 2022/0005820 | A1 * | 1/2022 | Kim | H10B 41/40 |
| 2022/0028734 | A1 * | 1/2022 | Shih | H10W 20/056 |
| 2022/0254998 | A1 * | 8/2022 | Itoh | H10N 70/021 |
| 2022/0359651 | A1 * | 11/2022 | Chang | H10D 1/68 |
| 2023/0049165 | A1 * | 2/2023 | Cha | H01L 25/18 |
| 2023/0135326 | A1 * | 5/2023 | Wu | H10B 43/10 |
| 2023/0187396 | A1 * | 6/2023 | Oh | H01L 25/18 257/777 |
| 2023/0402395 | A1 * | 12/2023 | Noda | H10B 63/80 |

* cited by examiner

SEMICONDUCTOR STRUCTURE INCLUDING MEMORY ELEMENT

This application claims the benefit of Taiwan application Serial No. 112124747, filed on Jul. 3, 2023, the subject matter of which is incorporated herein by reference.

BACKGROUND

Technical Field

The disclosure relates to a semiconductor structure, and more particularly to a semiconductor structure including a memory element.

Description of the Related Art

Resistance random access memory (RRAM) is the promising candidate for the next generation of non-volatile memory. A resistance random access memory stores data within a resistive switching film. With applying appropriate voltage, the resistive switching film can be switched between a high resistance state and a low resistance state repeatedly to store the digital information. However, there are still several important issues unaddressed in the development of semiconductor structure including a resistance random access memory, among which, how to reduce or avoid damage to layers and elements in a semiconductor structure is a big concern. In general, damage to layers and elements degrades the electrical performance of semiconductor structure.

SUMMARY

The present disclosure relates to a semiconductor structure. Damage to elements in the semiconductor structure of the present disclosure can be reduced or avoided, and the electrical performance of semiconductor structure can be improved.

According to an embodiment of the present disclosure, a semiconductor structure is provided. The semiconductor structure includes a plurality of interconnection layers disposed along a first direction, a memory element in the plurality of interconnection layers, a first conductive structure in the plurality of interconnection layers and electrically connected to the memory element, and a second conductive structure in the plurality of interconnection layers and electrically connected to the memory element. The first conductive structure includes a first conductive line and a second conductive line disposed along the first direction. The second conductive structure includes a third conductive line and a fourth conductive line disposed along the first direction. The second conductive line and the memory element are in the same interconnection layer. The third conductive line and the fourth conductive line are above the first conductive line and the second conductive line.

The above and other embodiments of the disclosure will become better understood with regard to the following detailed description of the non-limiting embodiment(s). The following description is made with reference to the accompanying drawings.

DETAILED DESCRIPTION

The illustrations may not be necessarily drawn to scale, and there may be other embodiments of the present disclosure which are not specifically illustrated. Thus, the specification and the drawings are to be regarded as an illustrative sense rather than a restrictive sense. Moreover, the descriptions disclosed in the embodiments of the disclosure such as detailed construction, manufacturing steps and material selections are for illustration only, not for limiting the scope of the disclosure. The steps and elements in details of the embodiments could be modified or changed according to the actual needs of the practical applications. It is contemplated that the elements and features of one embodiment can be beneficially incorporated in another embodiment without further recitation. The disclosure is not limited to the descriptions of the embodiments. The illustration uses the same/similar symbols to indicate the same/similar elements.

Moreover, use of ordinal terms such as "first", "second", "third", etc., in the specification and claims to modify an element or a step does not by itself imply any priority, precedence, or order of one claim element or step over another, but are used merely as labels to distinguish one claim element or step having a certain name from another element or step having the same name (but for use of the ordinal term) to distinguish the claim elements or steps. The term "electrically connected" used in the specification and claims can refer to direct contact between elements and there is a current path through these elements; or alternatively, the term "electrically connected" can means that there is no direct contact between elements (for example, there may be other elements between these elements), but there is still a current path through these elements.

Figure 1:
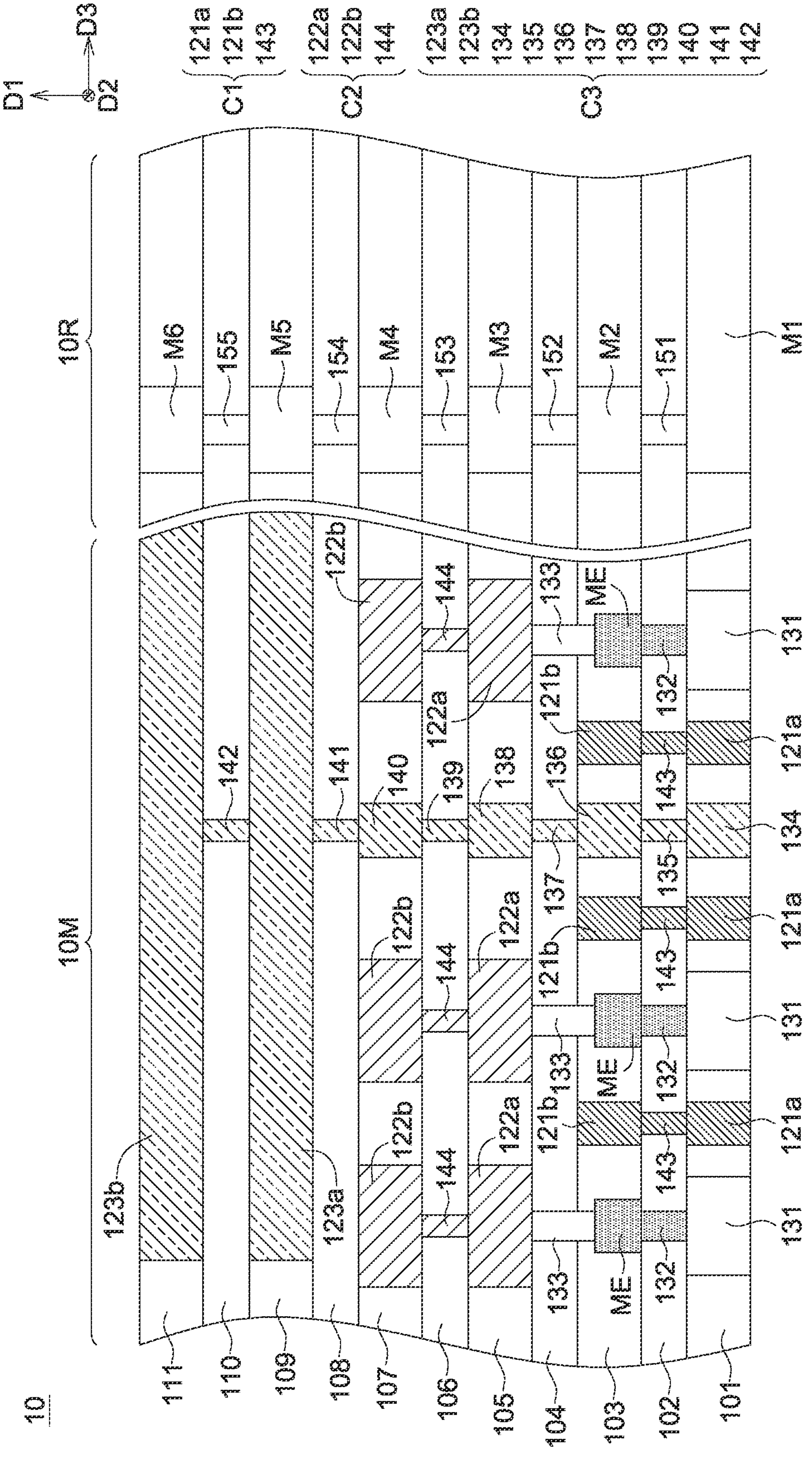
FIG. 1 shows a schematic view of a semiconductor structure according to an embodiment of the present disclosure.
Figure 2:
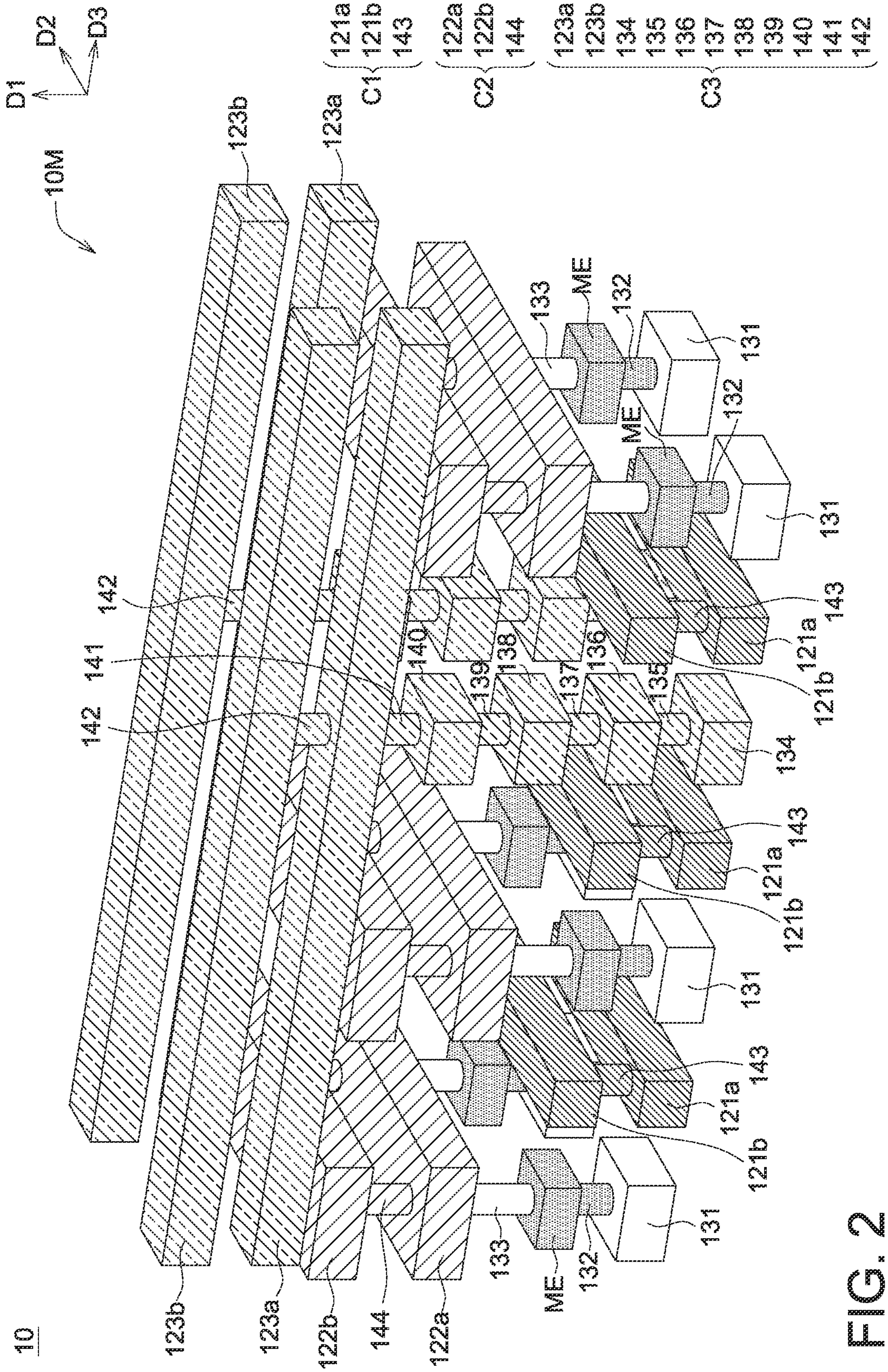
FIG. 2 shows a schematic view of a semiconductor structure according to an embodiment of the present disclosure.

Please refer to FIGS. 1 to 2, FIG. 1 shows a schematic view of a semiconductor structure 10 according to an embodiment, and FIG. 2 shows a schematic view of the semiconductor structure 10 according to an embodiment. The semiconductor structure 10 includes interconnection layers 101~111 disposed along a first direction D1. The interconnection layers 101~111 are sequentially disposed from bottom to top. The interconnection layers 101~111 may include dielectric materials such as oxide. The interconnection layers 101~111 may include a memory region 10M and a logic region 10R adjacent to the memory region 10M. In the memory region 10M of the interconnection layers 101~111, the semiconductor structure 10 includes memory elements ME, first conductive structures C1, second conductive structures C2, third conductive structures C3, vias 132 and 133, and contacts 131. The memory elements ME are disposed in the interconnection layer 103 at intervals. The first conductive structures C1, the second conductive structures C2, and the third conductive structures C3 are electrically connected to the memory elements ME. For example, the memory elements ME can be resistive memory elements. Resistive memory element means any memory element involving electrical resistance change, such as transition metal oxide resistive random-access memory cell, conductive bridging random access memory cell, phase-change memory cell or other suitable resistive memory element. In an embodiment, the memory element ME includes a first electrode, a second electrode and a resistive switching film between the first electrode and the second electrode. In an embodiment, with applying appropriate voltage to the first electrode and the second electrode, a conductive filament can be induced in the resistive switching film. The conductive filament penetrates the resistive switching film. The opposite ends of the conductive filament can contact the first electrode and the second electrode respectively. The conductive filament can be used as a conductive path between the first electrode and the second electrode. When the conductive filament is formed, the resistance random access memory is in a low resistance state. Then, another voltage can be applied to the first electrode and the second electrode to break the conductive filament, and the resistance random access memory is switched from a low resistance state to a high resistance state. The first electrode and the second electrode may include conductive materials, such as copper (Cu), tantalum nitride (TaN), titanium nitride (TIN), or titanium (Ti).

The first conductive structure C1 includes a first conductive line 121*a*, a via 143 and a second conductive line 121*b* disposed along the first direction D1. The first conductive line 121*a*, the via 143 and the second conductive line 121*b* are sequentially disposed from bottom to top. The first conductive line 121*a* and the second conductive line 121*b* extend along a second direction D2. The first conductive line 121*a*, the via 143 and the second conductive line 121*b* are electrically connected to each other. The first conductive line 121*a* is in the interconnection layer 101. The via 143 is in the interconnection layer 102. The second conductive line 121*b* is in the interconnection layer 103. The second conductive line 121*b* and the memory element ME can be in the same interconnection layer. An upper surface of the second conductive line 121*b* is higher than an upper surface of the memory element ME. The upper surface of the second conductive line 121*b* may be coplanar with an upper surface of the interconnection layer 103. The first conductive structures C1 may be disposed along a third direction D3 at intervals. One of the first conductive structures C1 is between two adjacent memory elements ME in the third direction D3. The first direction D1, the second direction D2 and the third direction D3 are perpendicular to each other. The first conductive line 121*a*, the via 143 and the second conductive line 121*b* may include conductive materials, such as aluminum (Al), copper (Cu) and tungsten (W).

The second conductive structure C2 includes a third conductive line 122*a*, a via 144 and a fourth conductive line 122*b* disposed along the first direction D1. The third conductive line 122*a*, the via 144 and the fourth conductive line 122*b* are sequentially disposed from bottom to top. The third conductive line 122*a* and the fourth conductive line 122*b* extend along the second direction D2. The third conductive line 122*a*, the via 144 and the fourth conductive line 122*b* are electrically connected to each other. The third conductive line 122*a* is in the interconnection layer 105. The via 144 is in the interconnection layer 106. The fourth conductive line 122*b* is in the interconnection layer 107. In the first direction D1, the third conductive line 122*a* and the fourth conductive line 122*b* are above the first conductive line 121*a* and the second conductive line 121*b*. The second conductive structures C2 may be disposed along the third direction D3 at intervals. The third conductive line 122*a*, the via 144 and the fourth conductive line 122*b* may include conductive materials, such as aluminum (Al), copper (Cu) and tungsten (W).

The third conductive structure C3 includes a contact 134, a via 135, a contact 136, a via 137, a contact 138, a via 139, a contact 140, a via 141, a fifth conductive line 123*a*, a via 142 and a sixth conductive line 123*b* disposed along the first direction D1. The contact 134, the via 135, the contact 136, the via 137, the contact 138, the via 139, the contact 140, the via 141, the fifth conductive line 123*a*, the via 142 and the sixth conductive line 123*b* are sequentially disposed from bottom to top. The fifth conductive line 123*a* and the sixth conductive line 123*b* extend along the third direction D3. The contact 134, the via 135, the contact 136, the via 137, the contact 138, the via 139, the contact 140, the via 141, the fifth conductive line 123*a*, the via 142 and the sixth conductive line 123*b* are electrically connected to each other. The contact 134 is in the interconnection layer 101. The via 135 is in the interconnection layer 102. The contact 136 is in the interconnection layer 103. The via 137 is in the interconnection layer 104. The contact 138 is in the interconnection layer 105. The via 139 is in the interconnection layer 106. The contact 140 is in the interconnection layer 107. The via 141 is in the interconnection layer 108. The fifth conductive line 123*a* is in the interconnection layer 109. The via 142 is in the interconnection layer 110. The sixth conductive line 123*b* is in the interconnection layer 111. In the first direction D1, The fifth conductive line 123*a* and the sixth conductive line 123*b* are above the third conductive line 122*a* and the fourth conductive line 122*b*. The third conductive structures C3 may be disposed along the second direction D2 at intervals. The contact 134, the via 135, the contact 136, the via 137, the contact 138, the via 139, the contact 140, the via 141, the fifth conductive line 123*a*, the via 142 and the sixth conductive line 123*b* may include conductive materials, such as aluminum (Al), copper (Cu) and tungsten (W).

The contacts 131 are disposed in the interconnection layer 101 at intervals. The vias 132 are disposed in the interconnection layer 102 at intervals. The vias 133 are disposed in the interconnection layer 103 and the interconnection layer 104 at intervals. A portion of the via 133 is in the interconnection layer 103. A portion of the via 133 is in the interconnection layer 104. A portion of the via 133 penetrates the interconnection layer 104. The memory element ME can be electrically connected to the contact 131 through the via 132. The memory element ME can be electrically connected to the third conductive line 122*a* of the second conductive structure C2 through the via 133. The contact 131, the via 132 and the via 133 may include conductive materials, such as aluminum (Al), copper (Cu) and tungsten (W).

A height of the second conductive line 121*b* in the first direction D1 can be larger than a height of the memory element ME in the first direction D1. A width of the memory element ME in the third direction D3 can be larger than a width of the second conductive line 121*b* in the third direction D3. A width of the memory element ME in the third direction D3 can be larger than a width of the first conductive line 121*a* in the third direction D3. A width of the memory element ME in the third direction D3 can be smaller than a width of the contact 131 in the third direction D3. A width of the memory element ME in the third direction D3 can be smaller than a width of the third conductive line 122*a* in the third direction D3. A width of the memory element ME in the third direction D3 can be smaller than a width of the fourth conductive line 122*b* in the third direction D3. In a plane formed by the direction D2 and the third direction D3, a cross-sectional area of the memory element ME can be smaller than a cross-sectional area of the contact 131.

Voltages can be applied to the first conductive structure C1, the second conductive structure C2 and the third conductive structure C3 to control the memory element ME. In an embodiment, the first conductive line 121*a* and the second conductive line 121*b* can be functioned as source lines, the third conductive line 122*a* and the fourth conductive line 122*b* can be functioned as bit lines, and the fifth conductive line 123*a* and the sixth conductive line 123*b* can be functioned as word lines. In other embodiments, the first conductive line 121*a* and the second conductive line 121*b* can be functioned as bit lines, the third conductive line 122*a* and the fourth conductive line 122*b* can be functioned as source lines, and the fifth conductive line 123*a* and the sixth conductive line 123*b* can be functioned as word lines.

In the logic region 10R of the interconnection layers 101~111, the semiconductor structure 10 includes a metal wire M1 in the interconnection layer 101, a via 151 in the interconnection layer 102, a metal wire M2 in the interconnection layer 103, a via 152 in the interconnection layer 104, a metal wire M3 in the interconnection layer 105, a via 153 in the interconnection layer 106, a metal wire M4 in the interconnection layer 107, a via 154 in the interconnection layer 108, a metal wire M5 in the interconnection layer 109, a via 155 in the interconnection layer 110, and a metal wire M6 in the interconnection layer 111. The metal wire M1, the via 151, the metal wire M2, the via 152, the metal wire M3, the via 153, the metal wire M4, the via 154, the metal wire M5, the via 155, and the metal wire M6 are electrically connected to each other. The metal wires M1~M6 and the vias 151~155 may include conductive materials, such as aluminum (Al), copper (Cu) and tungsten (W). In the logic region 10R of the interconnection layers 101~111, the semiconductor structure 10 may include a logic device such as a logic circuit. An upper surface of the memory element ME may be lower than an upper surface of the metal wire M2. An upper surface of the second conductive line 121*b* may be at the same height as an upper surface of the metal wire M2. The memory element ME, the second conductive line 121*b* and the metal wire M2 are in the same interconnection layer.

In an embodiment, the semiconductor structure 10 may include a semiconductor device or a semiconductor substrate below the interconnection layers 101~111 in the first direction D1.

As shown in FIGS. 1 to 2, the semiconductor structure 10 may include eleven interconnection layers disposed along the first direction D1 (e.g. the interconnection layers 101~111), but the present disclosure is not limited thereto. The present disclosure can be applied to a semiconductor structure including interconnection layers along the first direction D1 (such as more than eleven interconnection layers or less than eleven interconnection layers).

In the semiconductor structure of the present disclosure, the memory element and at least one conductive line are in the same interconnection layer; with such a configuration, during a planarization process (such as a chemical-mechanical planarization (CMP)) to this interconnection layer, the conductive line can be used as a support to improve or avoid the problem of over polishing and improve or avoid damage to elements in the semiconductor structure, and thereby improving the electrical performance and process window of semiconductor structure. Moreover, the upper surface of the conductive line is higher than the upper surface of the memory element located in the same interconnect layer, which can further reduce or avoid damage to elements in the semiconductor structure, and can improve the electrical performance of semiconductor structure. Furthermore, the number of interconnection layers can be reduced by arranging the memory element and at least one conductive line in the same interconnection layer, and thus a semiconductor structure with a smaller size can be obtained.

The present disclosure is not limited to the above embodiments and can be adjusted or varied properly according to actual demands. For example, the semiconductor structure may comprise other layers or have other arrangements. Therefore, the specification and the structures shown in the drawings are used to describe the concepts of the embodiments, and the scope of the invention is not limited thereto. Moreover, it could be understood that the elements in the embodiments are not limited to the shape and the configuration shown in the drawings, and can be adjusted according to the demand and/or process steps of actual applications without deviating from the spirit of the invention.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising: a plurality of interconnection layers disposed along a first direction; a memory element in the plurality of interconnection layers; a first conductive structure in the plurality of interconnection layers and electrically connected to the memory element, wherein the first conductive structure comprises a first conductive line and a second conductive line disposed along the first direction; and a second conductive structure in the plurality of interconnection layers and electrically connected to the memory element, wherein the second conductive structure comprises a third conductive line and a fourth conductive line disposed along the first direction, wherein the second conductive line and the memory element are in the same interconnection layer, and the third conductive line and the fourth conductive line are above the first conductive line and the second conductive line, wherein the second conductive line at least partially overlaps with the memory element in a second direction perpendicular to the first direction an upper surface of the second conductive line is higher than an upper surface of the memory element.

2. The semiconductor structure according to claim 1, wherein the memory element is a resistive memory element.

3. The semiconductor structure according to claim 1, wherein the first conductive line and the second conductive line are source lines, and the third conductive line and the fourth conductive line are bit lines.

4. The semiconductor structure according to claim 1, wherein the first conductive line and the second conductive line are bit lines, and the third conductive line and the fourth conductive line are source lines.

5. The semiconductor structure according to claim 1, wherein the second conductive line at least partially overlaps with the memory element in a second direction perpendicular to the first direction.

6. A semiconductor structure, comprising:

a plurality of interconnection layers disposed along a first direction;

a memory element in the plurality of interconnection layers;

a first conductive structure in the plurality of interconnection layers and electrically connected to the memory element, wherein the first conductive structure comprises a first conductive line and a second conductive line disposed along the first direction;

a second conductive structure in the plurality of interconnection layers and electrically connected to the memory element, wherein the second conductive structure comprises a third conductive line and a fourth conductive line disposed along the first direction; and a third conductive structure in the plurality of interconnection layers and electrically connected to the memory element, wherein the third conductive structure comprises a fifth conductive line and a sixth conductive line disposed along the first direction, and the fifth conductive line and the sixth conductive line are above the third conductive line and the fourth conductive line, wherein the second conductive line and the memory element are in the same interconnection layer, and the third conductive line and the fourth conductive line are above the first conductive line and the second conductive line.

7. The semiconductor structure according to claim 6, wherein the fifth conductive line and the sixth conductive line are word lines.

8. The semiconductor structure according to claim 7, wherein the first conductive line and the second conductive line are source lines, and the third conductive line and the fourth conductive line are bit lines.

9. The semiconductor structure according to claim 7, wherein the first conductive line and the second conductive line are bit lines, and the third conductive line and the fourth conductive line are source lines.

10. The semiconductor structure according to claim 6, wherein the first conductive line, the second conductive line, the third conductive line and the fourth conductive line extend along a second direction, the fifth conductive line and the sixth conductive extend along a third direction, and the first direction, the second direction and the third direction are perpendicular to each other.

11. The semiconductor structure according to claim 10, wherein a width of the memory element in the third direction is smaller than a width of the third conductive line in the third direction.

12. The semiconductor structure according to claim 10, wherein a width of the memory element in the third direction is larger than a width of the second conductive line in the third direction.

13. The semiconductor structure according to claim 10, wherein a width of the memory element in the third direction is larger than a width of the first conductive line in the third direction.

14. The semiconductor structure according to claim 6, wherein an upper surface of the second conductive line is higher than an upper surface of the memory element.

15. The semiconductor structure according to claim 6, wherein the memory element is a resistive memory element.

16. A semiconductor structure, comprising:

a plurality of interconnection layers disposed along a first direction;

a memory element in the plurality of interconnection layers;

a first conductive structure in the plurality of interconnection layers and electrically connected to the memory element, wherein the first conductive structure comprises a first conductive line and a second conductive line disposed along the first direction; and a second conductive structure in the plurality of interconnection layers and electrically connected to the memory element, wherein the second conductive structure comprises a third conductive line and a fourth conductive line disposed along the first direction, wherein the second conductive line and the memory element are in the same interconnection layer, and the third conductive line and the fourth conductive line are above the first conductive line and the second conductive line, the first conductive line and the second conductive line are source lines, and the third conductive line and the fourth conductive line are bit lines.

17. The semiconductor structure according to claim 16, wherein the memory element is a resistive memory element.

18. The semiconductor structure according to claim 16, wherein the first conductive line, the second conductive line, the third conductive line and the fourth conductive line extend along a second direction perpendicular to the first direction.

19. The semiconductor structure according to claim 18, further comprising a word line electrically connected to the memory element and above the third conductive line, wherein the word line extend along a third direction, and the first direction, the second direction and the third direction are perpendicular to each other.

20. The semiconductor structure according to claim 16, wherein the second conductive line at least partially overlaps with the memory element in a second direction perpendicular to the first direction.

* * * * *